United States Patent [19]

Bhattacharya et al.

[11] Patent Number: 5,785,837
[45] Date of Patent: *Jul. 28, 1998

[54] PREPARATION OF TRANSPARENT CONDUCTORS FERROELECTRIC MEMORY MATERIALS AND FERRITES

[75] Inventors: Raghu Nath Bhattacharya, Littleton; David S. Ginley, Evergreen, both of Colo.

[73] Assignee: Midwest Research Institute, Kansas City, Mich.

[*] Notice: The term of this patent shall not extend beyond the expiration date of Pat. No. 5,462,647.

[21] Appl. No.: 582,142

[22] Filed: Jan. 2, 1996

[51] Int. Cl.$^6$ .............................. C25C 1/24; C25C 5/02; C25D 5/50

[52] U.S. Cl. .............................. 205/74; 205/67; 205/76; 205/224; 205/225; 205/236; 205/538; 205/543; 205/544; 205/545; 205/557; 205/559

[58] Field of Search ............................... 205/74, 67, 76, 205/224, 225, 227, 236, 557, 559, 538, 543, 544, 545

[56] References Cited

U.S. PATENT DOCUMENTS

| | | | |
|---|---|---|---|
| 3,607,675 | 9/1971 | Haines | 427/132 |
| 3,836,436 | 9/1974 | Rivola et al. | 205/74 |
| 3,843,491 | 10/1974 | Piro et al. | 205/74 |
| 3,994,785 | 11/1976 | Rippere | 205/74 |
| 4,882,014 | 11/1989 | Coyle et al. | 205/45 |
| 5,370,784 | 12/1994 | Kammel et al. | 205/74 |
| 5,413,987 | 5/1995 | Bhattacharya et al. | 505/492 |
| 5,462,647 | 10/1995 | Bhattacharya et al. | 205/74 |
| 5,555,486 | 9/1996 | Kingon et al. | 361/305 |

OTHER PUBLICATIONS

Bhattacharya, R. N. et al., "Electrodeposition of CuInX (X=Se, Te) Thin Films," *Solar Cells*, vol. 16, 1983, pp. 237–243. month of publication not available.

Sudo, Y. et al., "Preparation and Characterization of Electrodeposited CuInSe$_2$ Thin Films," *Jpn. J. Appl. Phys.*, vol. 32, 1993, pp. 1562–1567. month of publication not available.

Kapur, V.K. et al., "Low Cost Methods for the Production of Semiconductor Films for CuInSe$_2$/CdS Solar Cells," *Solar Cells*, vol. 21, 1987, pp. 65–72. month of publication not available.

Herrero, J. et al., "Electrochemical Synthesis of Photoactive In$_2$Se$_3$ Thin Films," *Solar Energy Materials*, vol. 16, 1987, pp. 477–485. month of publication not available.

Guillen, C. et al., "Optical Properties of Electrochemically Deposited CuInSe$_2$ Thin Films," *Instituto de Energias Renovables*, 1991, pp. 34–45. month of publication not available.

Pern, F. J. et al., "Device Quality Thin Films of CuInSe$_2$ By A One-Step Electrodeposition Process," *Solar Energy Research Inst.*, 1987, pp. 81–91. month of publication not available.

Guillemoles, J. F. et al., "Recrystallization of Electrodeposited CuInSe$_2$ Thin Films in an Atmosphere of Elemental Se," *Advanced Materials*, 1994, pp. 376–379. month of publication not available.

F. A. Lowenheim, *Electroplating*, McGraw-Hill Book Co., New York, 1978, pp. 365–377. month of publication not available.

A. Rose et al, *The Condensed Chemical Dictionary*, Seventh Edition, Reinhold Book Corp., New York, 1968, pp. 414. month of publication not available.

*Primary Examiner*—Kathryn L. Gorgos
*Assistant Examiner*—William T. Leader
*Attorney, Agent, or Firm*—Edna M. O'Connor; Ken Richardson

[57] ABSTRACT

A process for the preparation by electrodeposition of metal oxide film and powder compounds for ferroelectric memory materials and ferrites wherein the metal oxide includes a plurality of metals. The process comprises providing an electrodeposition bath, providing soluble salts of the metals to this bath, electrically energizing the bath to thereby cause formation of a recoverable film of metal on the electrode, recovering the resultant film as a film or a powder, and recovering powder formed on the floor of the bath. The films and powders so produced are subsequently annealed to thereby produce metal oxide for use in electronic applications. The process can be employed to produce metal-doped metal oxide film and powder compounds for transparent conductors. The process for preparation of these metal-doped metal oxides follows that described above.

9 Claims, No Drawings

PREPARATION OF TRANSPARENT CONDUCTORS FERROELECTRIC MEMORY MATERIALS AND FERRITES

The United States Government has rights in this invention under Contract No. DE AC36-83CH10093 between the United States Department of Energy and the National Renewable Energy Laboratory, a division of the Midwest Research Institute.

BACKGROUND OF THE INVENTION

I. Field of the Invention

The present invention relates to a process for the preparation by electrodeposition of transparent conductors, ferroelectric memory materials and ferrites.

II. Description of the Prior Art

Transparent conductors, ferroelectric memory materials and ferrites are rapidly being developed for employment in a variety of electronic and optoelectronic apparatus including computing, data processing, sensing and communication devices. Non-limiting examples of possible direct uses include memories, modulators, switches, shutters, mixers, sensors, imagers, filters and displays. Non-limiting examples of compounds meeting specifications for such use include strontium ruthenium oxide, barium titanium oxide, lead titanium oxide, nickel ferrous oxide, zinc ferrous oxide, lanthanum strontium cobalt oxide, aluminum-doped zinc oxide and tin-doped indium oxide.

Present preparation techniques for the production of films and powders of such compounds involve traditional chemical reactions to isolate components, coupled with physical mixing of the component metals. Maintaining product uniformity of resulting products so prepared is extremely difficult if not realistically impossible. It is therefore apparent, in view of the potential utilities of such films and powders, that a need is present for an efficient and uniformly productive process for the preparation of films and powders through electrodeposition techniques that deposit all of the precursor components simultaneously while providing atomic-scale mixing that reduces reaction time to the order of minutes to obtain desired phase development.

Accordingly, a primary object of the present invention is to provide a process employing electrodeposition for the production of reactive atomically mixed powders of such compounds.

Another object of the present invention is to provide a process employing electrodeposition for the preparation of reactive atomically mixed films of such compounds.

Another object of the present invention is to provide an electrodeposition process wherein powders so produced are recovered either from the electrode-substrate by ultrasonic vibration, for example, or from the bath as a precipitate which has peeled from the electrode-substrate.

These and other objects of the present invention will become apparent throughout the description of the invention which now follows.

SUMMARY OF THE INVENTION

The present invention is a process for the preparation by electrodeposition of metal oxide film and powder compounds for ferroelectric memory materials and ferrites wherein the metal oxide comprises a plurality of metals. The process comprises the steps of, first of all, providing an electrodeposition bath comprising an electrolyte medium and a cathode substrate electrode, and providing to this bath soluble salts of each of the metals. Thereafter, the bath is electrically energized to thereby direct ions of each respective metal in the bath to the substrate electrode to thereby cause formation of metallic and/or reduced particles as a film of the plurality of metals. If the electrodeposition process is continued, plurality-of-metal powder is formed and recovered, as described below. Recovery of plurality-of-metal film deposited on the substrate electrode can be accomplished by taking the substrate electrode with film thereon from the bath, cleaning the film in an appropriate solvent, and drying it at room temperature.

Recovery of plurality-of-metal powder can be accomplished by continually energizing the bath to thereby cause powder initially deposited on the substrate-electrode to drop therefrom into the bath from which it is subsequently removed. A second recovery alternative comprises energizing the bath for a period of time sufficient to cause plurality-of-metal powder deposition on the substrate-electrode only, without subsequent powder drop off. The substrate-electrode thereafter is subjected to a powder removal process such as an ultrasonic environment for example to thereby recover the deposited plurality-of-metal powder.

Plurality-of-metal film and powder so produced by the electrodeposition methodology described herein are subsequently completely oxidized by annealing them under favorable ambient conditions for a time and temperature sufficient to accomplish metal oxide and phase formation. Non-limiting representative oxide compounds include $SrRuO_2$, $BaTiO_3$, $PbTiO_3$, $NiFe_2O_4$, $ZnFe_2O_4$, $LaSrCoO_2$, $(PbLa)(ZnTi)O_3$, $Pb(MgNb)O_3$, $LiNbO_3$, $KNbO_3$, $KTaO_3$, $K(TaNb)O_3$, $(SrBa)Nb_2O_6$, $(PbBa)Nb_2O_6$, $(KSr)Nb_2O_6$, $Bi_4Ti_3O_{11}$, $Li(NbTa)O_3$, $ZnSnO_3$, $Ba_2NaNb_5O_{15}$, $Bi_4Ti_3O_{12}$, $LiTaO_3$, $Ba_{2-x}Sr_xK_{1-y}Na_yNb_5O_{15}$, $(PaBa)Nb_2O_6$, $Pb_2KNb_5O_{15}$, $K_3Li_2Nb_5O_{15}$, $Pb_xBa_{1-x}TiO_3$, $Pb(Fe_{0.5}Nb_{0.5})O_3$, $Ba(Mg_{1/3}Ta_{2/3})O_3$, $PbTi_{1-x}Zn_xO_3$, $CdSnO$, $ZnInSnO_x$ and $ZnGa_2O_4$.

The invention also includes a process for the preparation of metal-doped metal oxide film and powder compounds for transparent conductors. The process for preparation of these metal-doped metal oxides follows that described above. Non-limiting representative metal-doped metal oxide compounds include Al-doped ZnO, Sn-doped $In_2O_3$, Zn-doped $BaTiO_3$, Ta-doped $TiO_2$ and Sn-doped $GaInO_3$.

Each of the films and powders prepared according to the present invention exhibits uniformity, enhanced reactivity, reproducibility of content, and is readily usable in a wide range of applications.

DETAILED DESCRIPTION OF THE PREFERRED EMBODIMENT

The preferred embodiment of the present invention is a process for the preparation by electrodeposition of XY oxide, A-doped B oxide and lanthanum strontium cobalt oxide films and powders for electronic applications. X and Y are a pair of metals and respectively are chosen from the group consisting of the pairs strontium and ruthenium, barium and titanium, lead and titanium, nickel and iron, and zinc and iron; A and B are a pair of metals and respectively are chosen from the group consisting of the pairs aluminum and zinc, and tin and indium.

EXAMPLE 1a

An electrodeposition bath containing (1) metal salts dissolved in dimethylsulfoxide (DMSO—an aprotic electrolyte medium); (2) a cathode silver-foil substrate electrode; (3) a platinum gauze counter electrode; and (4) a silver pseudo-electrode is prepared. A DMSO-salt solution was prepared by dissolving 2.116 gm Sr(NO$_3$)$_2$ and 2.074 gm RuCl$_3$ in 100 ml DMSO. The bath was energized for 1 to 15 minutes in the range of about −3V to −6V (vs. silver pseudo reference electrode) to thereby direct ions of each metal in the bath to the substrate-electrode and cause deposition of metallic particles at the electrode as a Sr—Ru film. Deposition temperature was from about 25° C. to about 75° C. The film was cleaned in DMSO, methanol and/or toluene and subsequently dried in open air at room temperature. The film subsequently was recovered and annealed in flowing oxygen at a temperature of from about 475° C. to about 575° C. for about 10 minutes to thereby produce SrRuO$_2$, a ferroelectric memory material.

EXAMPLE 1b

In the same manner as in Example 1a, a bath was prepared and energized for 1 to 15 minutes to thereby direct ions of each metal in the bath to the substrate-electrode and cause deposition of metallic particles at the electrode as a Sr—Ru film. Deposition temperature likewise was from about 25° C. to about 75° C. The film subsequently was recovered as a powder from the substrate-electrode by subjecting the coated substrate-electrode to an ultrasonic environment to thereby cause the Sr—Ru composition to dislodge. The recovered powder then was cleaned in DMSO, methanol and/or toluene, subsequently dried on a hot plate in open air at about 100° C., and thereafter annealed in flowing oxygen at a temperature of from about 475° C. to about 575° C. for about 10 minutes to thereby produce SrRuO$_2$.

EXAMPLE 1c

In the same manner as in Example 1a, a bath was prepared and energized, except for a period of 1 to 8 hours, to likewise direct ions of each metal in the bath to the substrate-electrode and cause formation of metallic particles at that electrode. After an adhering Sr—Ru film first deposited on and remained with the substrate-electrode, the remainder of the continuing loosely-deposited particles peeled off of the electrode and accumulated as a fine intermixed Sr—Ru powder for subsequent recovery at the bottom of the bath. As in Example 1b, recovered powder then was cleaned in DMSO, methanol and/or toluene, subsequently dried on a hot plate in open air at about 100° C., and thereafter annealed in flowing oxygen at a temperature of from about 475° C. to about 575° C. for about 10 minutes to thereby produce SrRuO$_2$.

EXAMPLE 2a

The same procedure taught in Example 1a was followed, except that a DMSO-salt solution was prepared by dissolving 2.614 gm Ba(NO$_3$)$_2$ and 1.543 gm TiCl$_3$ in 100 ml DMSO to thereby deposit a Ba—Ti film at the electrode. The film was recovered and annealed as in Example 1a to thereby produce BaTiO$_3$, a ferroelectric memory material.

EXAMPLE 2b

The same procedure taught in Example 1b was followed, except that a DMSO-salt solution was prepared according to Example 2a to thereby cause the deposition of a Ba—Ti film at the electrode. The film was recovered as a powder and annealed as in Example 1b to thereby produce BaTiO$_3$.

EXAMPLE 2c

The same procedure taught in Example 1c was followed, except that a DMSO-salt solution was prepared according to Example 2a to thereby cause the deposition of a Ba—Ti powder at the bottom of the bath. This powder was recovered and annealed as in Example 1c to thereby produce BaTiO$_3$.

EXAMPLE 3a

The same procedure taught in Example 1a was followed, except that a DMSO-salt solution was prepared by dissolving 3.312 gm Pb(NO$_3$)$_2$ and 1.543 gm TiCl$_3$ in 100 ml DMSO to thereby deposit a Pb—Ti film at the electrode. The film was recovered and annealed as in Example 1a to thereby produce PbTiO$_3$, a ferroelectric memory material.

EXAMPLE 3b

The same procedure taught in Example 1b was followed, except that a DMSO-salt solution was prepared according to Example 3a to thereby cause the deposition of a Pb—Ti film at the electrode. The film was recovered as a powder and annealed as in Example 1b to thereby produce PbTiO$_3$.

EXAMPLE 3c

The same procedure taught in Example 1c was followed, except that a DMSO-salt solution was prepared according to Example 3a to thereby cause the deposition of a Pb—Ti powder at the bottom of the bath. This powder was recovered and annealed as in Example 1c to thereby produce PbTiO$_3$.

EXAMPLE 4a

The same procedure taught in Example 1a was followed, except that a DMSO-salt solution was prepared by dissolving 2.908 gm Ni(NO$_3$)$_2$ and 4.040 gm Fe(NO$_3$)$_3$ in 100 ml DMSO to thereby deposit a Ni—Fe film at the electrode. The film was recovered and annealed as in Example 1a to thereby produce NiFe$_2$O$_4$, a ferrite material.

EXAMPLE 4b

The same procedure taught in Example 1b was followed, except that a DMSO-salt solution was prepared according to Example 4a to thereby cause the deposition of a Ni—Fe film at the electrode. The film was recovered as a powder and annealed as in Example 1b to thereby produce NiFe$_2$O$_4$.

EXAMPLE 4c

The same procedure taught in Example 1c was followed, except that a DMSO-salt solution was prepared according to Example 4a to thereby cause the deposition of a Ni—Fe powder at the bottom of the bath. This powder was recovered and annealed as in Example 1c to thereby produce NiFe$_2$O$_4$.

EXAMPLE 5a

The same procedure taught in Example 1a was followed, except that a DMSO-salt solution was prepared by dissolving 1.89 gm Zn(NO$_3$)$_2$ and 4.040 gm Fe(NO$_3$)$_3$ in 100 ml DMSO to thereby deposit a Zn—Fe film at the electrode. The film was recovered and annealed as in Example 1a to thereby produce ZnFe$_2$O$_4$, a ferrite material.

EXAMPLE 5b

The same procedure taught in Example 1b was followed, except that a DMSO-salt solution was prepared according to Example 5a to thereby cause the deposition of a Zn—Fe film at the electrode. The film was recovered as a powder and annealed as in Example 1b to thereby produce $ZnFe_2O_4$.

EXAMPLE 5c

The same procedure taught in Example 1c was followed, except that a DMSO-salt solution was prepared according to Example 5a to thereby cause the deposition of a Zn—Fe powder at the bottom of the bath. This powder was recovered and annealed as in Example 1c to thereby produce $ZnFe_2O_4$.

EXAMPLE 6a

The same procedure taught in Example 1a was followed, except that a DMSO-salt solution was prepared by dissolving 4.33 gm $La(NO_3)_2$, 2.12 gm $Sr(NO_3)_2$ and 2.91 gm $Co(NO_3)_2$ in 100 ml DMSO to thereby deposit a La—Sr—Co film at the electrode. The film was recovered and annealed as in Example 1a to thereby produce $LaSrCoO_2$, a ferroelectric memory material.

EXAMPLE 6b

The same procedure taught in Example 1b was followed, except that a DMSO-salt solution was prepared according to Example 6a to thereby cause the deposition of a La—Sr—Co film at the electrode. The film was recovered as a powder and annealed as in Example 1b to thereby produce $LaSrCoO_2$.

EXAMPLE 6c

The same procedure taught in Example 1c was followed, except that a DMSO-salt solution was prepared according to Example 6a to thereby cause the deposition of a La—Sr—Co powder at the bottom of the bath. This powder was recovered and annealed as in Example 1c to thereby produce $LaSrCoO_2$.

EXAMPLE 7a

The same procedure taught in Example 1a was followed, except that a DMSO-salt solution was prepared by dissolving 3.754 gm $Al(NO_3)_2$ and 18.9 gm $Zn(NO_3)_3$ in 100 ml DMSO, 10 ml water and 5 ml nitric acid (10%) to thereby deposit an Al—Zn film at the electrode. The film was recovered and annealed as in Example 1a to thereby produce Al-doped ZnO, a transparent conducting oxide.

EXAMPLE 7b

The same procedure taught in Example 1b was followed, except that a DMSO-salt solution was prepared according to Example 7a to thereby cause the deposition of an Al—Zn film at the electrode. The film was recovered as a powder and annealed as in Example 1b to thereby produce Al-doped ZnO.

EXAMPLE 7c

The same procedure taught in Example 1c was followed, except that a DMSO-salt solution was prepared according to Example 7a to thereby cause the deposition of an Al—Zn powder at the bottom of the bath. This powder was recovered and annealed as in Example 1c to thereby produce Al-doped ZnO.

EXAMPLE 8a

The same procedure taught in Example 1a was followed, except that a DMSO-salt solution was prepared by dissolving 3.506 gm $SnCl_3$ and 10.084 gm $In(NO_3)_2$ in 100 ml DMSO, 10 ml water and 5 ml nitric acid (10%) to thereby deposit a Sn—In film at the electrode. The film was recovered and annealed as in Example 1a to thereby produce Sn-doped $In_2O_3$, a transparent conducting oxide.

EXAMPLE 8b

The same procedure taught in Example 1b was followed, except that a DMSO-salt solution was prepared according to Example 8a to thereby cause the deposition of a Sn—In film at the electrode. The film was recovered as a powder and annealed as in Example 1b to thereby produce Sn-doped $In_2O_3$.

EXAMPLE 8c

The same procedure taught in Example 1c was followed, except that a DMSO-salt solution was prepared according to Example 8a to thereby cause the deposition of an Sn—In powder at the bottom of the bath. This powder was recovered and annealed as in Example 1c to thereby produce Sn-doped $In_2O_3$.

The oxide films and powders produced by electrodeposition according to the present invention are mixed on an atomic scale and exhibit superior reactivity for subsequent electronic applications apparent to the skilled artisan.

While an illustrative and presently preferred embodiment of the invention has been described in detail herein, it is to be understood that the inventive concepts may be otherwise variously embodied and employed and that the appended claims are intended to be construed to include such variations except insofar as limited by the prior art.

We claim:

1. A process for the preparation of a ferroelectric metal oxide film, wherein the ferroelectric metal oxide film comprises a plurality of metals selected from the group consisting of the groupings of Sr and Ru, Ba and Ti, Pb and Ti, Ni and Fe, Zn and Fe, La and Sr and Co, PbLa and ZnTi, Pb and MgNb, Li and Nb, K and Nb, K and Ta, K and TaNb, SrBa and Nb, PbBa and Nb, KSr and Nb, Bi and Ti, Li and NbTa, Zn and Sn, Ba and Na and Nb, Li and Ta, Ba and Sr and K and Na and Nb, Pb and K and Nb, K and Li and Nb, K and Li and Nb, Pb and Ba and Ti, Pb and FeNb, Ba and MgTa, Pb and Ti and Zn, Cd and Sn, Zn and In and Sn, and Zn and Ga, the process comprising the sequential steps of:

a) providing an electrodeposition bath comprising a non-aqueous, aprotic electrolyte medium and a cathode substrate electrode;

b) providing to the bath salts of each of the metals soluble in said non-aqueous, aprotic electrolyte;

c) electrically energizing the bath by applying a constant potential thereto between about −3V and about −6V to thereby direct ions of each respective metal in the bath to the substrate electrode to thereby cause formation of metallic particles as a film of the plurality of metals on the electrode;

d) recovering the film; and e) annealing the film in flowing oxygen at a temperature of about 475°–575° C. for a time sufficient to produce substantially complete metal oxide formation.

2. A process for the preparation of a ferroelectric metal oxide powder, wherein the ferroelectric metal oxide film comprises a plurality of metals selected from the group consisting of the groupings of Sr and Ru, Ba and Ti, Pb and Ti, Ni and Fe, Zn and Fe, La and Sr and Co, PbLa and ZnTi, Pb and MgNb, Li and Nb, K and Nb, K and Ta, K and TaNb, SrBa and Nb, PbBa and Nb, KSr and Nb, Bi and Ti, Li and NbTa, Zn and Sn, Ba and Na and Nb, Li and Ta, Ba and Sr and K and Na and Nb, Pb and K and Nb, K and Li and Nb, K and Li and Nb, Pb and Ba and Ti, Pb and FeNb, Ba and MgTa, Pb and Ti and Zn, Cd and Sn, Zn and In and Sn, and Zn and Ga, the process comprising the sequential steps of:

a) providing an electrodeposition bath comprising a non-aqueous, aprotic electrolyte medium and a cathode substrate electrode;

b) providing to the bath salts of each of the metals soluble in said non-aqueous, aprotic electrolyte;

c) electrically energizing the bath by applying a constant potential thereto between about −3V and about −6V to thereby direct ions of each respective metal in the bath to the substrate electrode to thereby cause formation of metallic particles as a film of the plurality of metals on the electrode;

d) continually energizing the bath to cause film formed at the electrode to drop as powder from the electrode into the bath;

e) recovering the powder from the bath; and f) annealing the powder in flowing oxygen at a temperature of about 475°–575° C. for a time sufficient to produce substantially complete metal oxide formation.

3. A process for the preparation of a ferroelectric metal oxide powder, wherein the ferroelectric metal oxide film comprises a plurality of metals selected from the group consisting of the groupings of Sr and Ru, Ba and Ti, Pb and Ti, Ni and Fe, Zn and Fe, La and Sr and Co, PbLa and ZnTi, Pb and MgNb, Li and Nb, K and Nb, K and Ta, K and TaNb, SrBa and Nb, PbBa and Nb, KSr and Nb, Bi and Ti, Li and NbTa, Zn and Sn, Ba and Na and Nb, Li and Ta, Ba and Sr and K and Na and Nb, Pb and K and Nb, K and Li and Nb, K and Li and Nb, Pb and Ba and Ti, Pb and FeNb, Ba and MgTa, Pb and Ti and Zn, Cd and Sn, Zn and In and Sn, and Zn and Ga, the process comprising the sequential steps of:

a) providing an electrodeposition bath comprising a non-aqueous, aprotic electrolyte medium and a cathode substrate electrode;

b) providing to the bath salts of each of the metals soluble in said non-aqueous, aprotic electrolyte;

c) electrically energizing the bath by applying a constant potential thereto between about −3V and about −6V to thereby direct ions of each respective metal in the bath to the substrate electrode to thereby cause formation of metallic particles as a film of the plurality metals on the electrode;

d) removing the electrode from the bath and subjecting the electrode to an ultrasonic environment to thereby ultrasonically remove the powder from the electrode;

e) recovering the powder; and f) annealing the powder in flowing oxygen at a temperature of about 475°–575° C. for a time sufficient to produce substantially complete metal oxide formation.

4. A process for the preparation of an XY oxide film wherein X and Y are a pair of metals and respectively are chosen from the group consisting of the pairs strontium and ruthenium, barium and titanium, lead and titanium, nickel and iron, and zinc and iron, the process comprising the sequential steps of:

a) providing an electrodeposition bath comprising a dimethyl sulfoxide solution electrolyte medium and a cathode substrate electrode;

b) providing to the bath salts of X and Y metals which are soluble in the electrolyte medium and are chosen from the group consisting of the pairs strontium nitrate and ruthenium chloride, barium nitrate and titanium chloride, lead nitrate and titanium chloride, nickel nitrate and ferric nitrate, and zinc nitrate and ferrous nitrate;

c) electrically energizing the bath by applying a constant potential thereto between about −3V and about −6V to thereby direct ions of each respective metal in the bath to the substrate electrode to thereby cause formation of metallic particles as a film of XY on the electrode;

d) recovering the film; and e) annealing the film in flowing oxygen at a temperature of about 475°–575° C. for a time sufficient to produce substantially complete XY metal oxide formation.

5. A process for the preparation of an XY oxide powder wherein X and Y are a pair of metals and respectively are chosen from the group consisting of the pairs strontium and ruthenium, barium and titanium, lead and titanium, nickel and iron, and zinc and iron, the process comprising the sequential steps of:

a) providing an electrodeposition bath comprising a dimethyl sulfoxide solution electrolyte medium and a cathode substrate electrode;

b) providing to the bath salts of X and Y metals which are soluble in the electrolyte medium and are chosen from the group consisting of the pairs strontium nitrate and ruthenium chloride, barium nitrate and titanium chloride, lead nitrate and titanium chloride, nickel nitrate and ferric nitrate, and zinc nitrate and ferrous nitrate;

c) electrically energizing the bath by applying a constant potential thereto between about −3V and about −6V to thereby direct ions of each respective metal in the bath to the substrate electrode to thereby cause formation of metallic particles as a film of XY on the electrode;

d) continually energizing the bath to cause film formed at the electrode to drop as powder from the electrode into the bath;

e) recovering the powder from the bath; and f) annealing the powder in flowing oxygen at a temperature of about 475°–575° C. for a time sufficient to produce substantially complete XY metal oxide formation.

6. A process for the preparation of an XY oxide powder wherein X and Y oxide are a pair of metals and respectively are chosen from the group consisting of the pairs strontium and ruthenium, barium and titanium, lead and titanium, nickel and iron, and zinc and iron, the process comprising the sequential steps of:

a) providing an electrodeposition bath comprising a dimethyl sulfoxide solution electrolyte medium and a cathode substrate electrode;

b) providing to the bath salts of X and Y metals which are soluble in the electrolyte medium and are chosen from the group consisting of the pairs strontium nitrate and ruthenium chloride, barium nitrate and titanium chloride, lead nitrate and titanium chloride, nickel nitrate and ferric nitrate, and zinc nitrate and ferrous nitrate;

c) electrically energizing the bath by applying a constant potential thereto between about −3V and about −6V to thereby direct ions of each respective metal in the bath to the substrate electrode to thereby cause formation of metallic particles as a film of XY on the electrode;

d) removing the electrode from the bath and subjecting the electrode to an ultrasonic environment to thereby ultrasonically remove the powder from the electrode;

e) recovering the powder; and f) annealing the powder in flowing oxygen at a temperature of about 475°–575° C. for a time sufficient to produce substantially complete XY metal oxide formation.

7. A process for the preparation of a lanthanum strontium cobalt oxide comprising the sequential steps of:

a) providing an electrodeposition bath comprising a dimethyl sulfoxide solution electrolyte medium and a cathode substrate electrode;

b) providing to the bath nitrate salts of lanthanum, strontium and cobalt metals; which are soluble in the electrolyte medium;

c) electrically energizing the bath by applying a constant potential thereto between about –3V and about –6V to thereby direct ions of each respective metal in the bath to the substrate electrode to thereby cause formation of metallic particles as a film of lanthanum-strontium-cobalt on the electrode;

d) recovering the film; and e) annealing the film in flowing oxygen at a temperature of about 475°–575° C. for a time sufficient to produce lanthanum strontium cobalt oxide.

8. A process for the preparation of a lanthanum strontium cobalt oxide powder comprising the sequential steps of:

a) providing an electrodeposition bath comprising a dimethyl sulfoxide solution electrolyte medium and a cathode substrate electrode;

b) providing to the bath nitrate salts of lanthanum, strontium and cobalt metals; which are soluble in the electrolyte medium;

c) electrically energizing the bath by applying a constant potential thereto between about –3V and about –6V to thereby direct ions of each respective metal in the bath to the substrate electrode to thereby cause formation of metallic particles as a film of lanthanum-strontium-cobalt on the electrode;

d) continually energizing the bath to cause film formed at the electrode to drop as powder from the electrode into the bath;

e) recovering the powder from the bath; and f) annealing the film in flowing oxygen at a temperature of about 475°–575° C. for a time sufficient to produce lanthanum strontium cobalt oxide.

9. A process for the preparation of a lanthanum strontium cobalt powder comprising the sequential steps of:

a) providing an electrodeposition bath comprising a dimethyl sulfoxide solution electrolyte medium and a cathode substrate electrode;

b) providing to the bath nitrate salts of lanthanum, strontium and cobalt metals which are soluble in the electrolyte medium;

c) electrically energizing the bath by applying a constant potential thereto between about –3V and about –6V to thereby direct ions of each respective metal in the bath to the substrate electrode to thereby cause formation of metallic particles as a film of lanthanum-strontium-cobalt on the electrode;

d) removing the electrode from the bath and subjecting the electrode to an ultrasonic environment to thereby ultrasonically remove the powder from the electrode;

e) recovering the powder; and f) annealing the film in flowing oxygen at a temperature of about 475°–575° C. for a time sufficient to produce lanthanum strontium cobalt oxide.

* * * * *